United States Patent
Hou et al.

(10) Patent No.: US 8,911,151 B2
(45) Date of Patent: Dec. 16, 2014

(54) SUBSTRATE SUPPORT BUSHING

(71) Applicant: Applied Materials, Inc., Santa Clara, CA (US)

(72) Inventors: Tao Hou, Palo Alto, CA (US); Jeonghoon Oh, San Jose, CA (US); Tom K. Cho, Los Altos, CA (US); Andrzej Matlosz, San Jose, CA (US); Frank F. Hooshdaran, Pleasanton, CA (US); Yao-Hung Yang, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/648,082

(22) Filed: Oct. 9, 2012

(65) Prior Publication Data

US 2013/0101241 A1    Apr. 25, 2013

Related U.S. Application Data

(60) Provisional application No. 61/549,604, filed on Oct. 20, 2011.

(51) Int. Cl.
*F16C 29/02*      (2006.01)
*C23C 16/458*    (2006.01)
*C23C 16/505*    (2006.01)
*H01L 21/687*    (2006.01)

(52) U.S. Cl.
CPC ............. *C23C 16/4586* (2013.01); *F16C 29/02* (2013.01); *C23C 16/505* (2013.01); *H01L 21/68742* (2013.01)
USPC .......................................................... 384/32

(58) Field of Classification Search
CPC .................... C23C 16/4586; H01L 21/68742; F16C 29/02
USPC ........................ 384/7, 26, 28, 30–32, 34, 42
See application file for complete search history.

(56) References Cited

U.S. PATENT DOCUMENTS 5,131,615 A * 7/1992 Hosan et al. .................... 384/32
5,313,865 A * 5/1994 Layton ............................ 384/30
(Continued)

FOREIGN PATENT DOCUMENTS

JP        2003124297        4/2003
KR  10-2009-0071751        7/2009
(Continued)

OTHER PUBLICATIONS

International Search Report and Written Opinion of the International Searching Authority mailed Dec. 26, 2012, in PCT/US2012/058232.

(Continued)

*Primary Examiner* — James Pilkington
(74) *Attorney, Agent, or Firm* — Patterson & Sheridan, LLP

(57) ABSTRACT

A bushing assembly for supporting a substrate within a processing chamber is generally provided. In one aspect, the bushing assembly comprises a tubular body having an outer perimeter and an aperture extending therethrough, a first ring having a first inner edge, the first ring disposed in the aperture in an upper portion of the tubular body, and a second ring having a second inner edge, the second ring disposed in the aperture in a lower portion of the tubular body. In another aspect, the first inner edge has a first radius of curvature, and the second inner edge has a second radius of curvature. In another aspect, a first inner edge diameter, a second inner edge diameter, the first radius of curvature, and the second radius of curvature are selected such that a support pin extending through the aperture contacts the bushing assembly on at most two points.

6 Claims, 4 Drawing Sheets

(56) References Cited

U.S. PATENT DOCUMENTS

| | | | |
|---|---|---|---|
| 5,848,670 A * | 12/1998 | Salzman | 187/272 |
| 6,887,317 B2 * | 5/2005 | Or et al. | 118/728 |
| 2007/0160507 A1 * | 7/2007 | Satoh et al. | 422/135 |
| 2008/0159667 A1 * | 7/2008 | Michioka et al. | 384/13 |
| 2010/0013626 A1 * | 1/2010 | Park et al. | 340/521 |
| 2011/0014396 A1 * | 1/2011 | Polyak | 427/569 |

FOREIGN PATENT DOCUMENTS

| | | |
|---|---|---|
| KR | 10-2010-0081285 | 7/2010 |
| WO | WO-2005-117097 | 12/2005 |

OTHER PUBLICATIONS

Merriam-Webster's Collegiate Dictionary; Eleventh Edition; 2012; pp. 224 and 1074.

* cited by examiner

SUBSTRATE SUPPORT BUSHING

CROSS-REFERENCE TO RELATED APPLICATIONS

This application claims benefit of U.S. Provisional Patent Application Ser. No. 61/549,604, filed Oct. 20, 2011, which is herein incorporated by reference in its entirety.

BACKGROUND OF THE INVENTION

1. Field of the Invention

Embodiments of the present invention generally relate to large area substrate processing systems. More particularly, embodiments of the present invention relate to a bushing for a support pin for large area substrates.

2. Description of the Related Art

Thin film transistors have been made on large area glass substrates or plates for use in monitors, flat panel displays, solar cells, personal digital assistants (PDA), cell phones, and the like. These transistors are made by sequential deposition of various films including amorphous silicon, doped and undoped silicon oxides, and silicon nitride in vacuum chambers. The film deposition may take place in a single deposition chamber, or the substrate being processed may be transferred between multiple deposition chambers.

In large area substrate processing systems, the substrate being processed typically rests on a substrate support, such as a susceptor, situated within the chamber. To facilitate transfer of the substrate between deposition chambers, support pins may extend through an upper surface of the substrate support and may be raised and lowered with respect to the substrate support so that the substrate may be spaced apart from the substrate support. This spacing allows a transfer mechanism, such as a robot blade, to slide underneath and lift the substrate off the substrate support without causing damage to the substrate support or the substrate.

The support pins are typically rigid, vertical posts of fixed height which extend through the substrate support. During processing, the substrate is placed on the support pins and the support pins are lowered in relation to the substrate support, placing the substrate in contact with the substrate support. After film deposition is complete, the support pins may be raised in relation to the substrate support, lifting the substrate from the substrate support.

A conventional support pin may include a holder or bushing, such as a slide bushing or roller bushing, which is designed to provide lateral support to the support pin and to facilitate movement of the support pin through the bushing along an axis perpendicular to the plane of the substrate support. Conventional slide bushings are typically fabricated from materials which have relatively low melting points, such as polytetrafluoroethylene (PTFE). Consequently, these bushings are unsuitable for use in processing environments of greater than about 250° C. Roller bushings, on the other hand, include moving parts, such as bearings and rollers. Consequently, these bushings are expensive to produce and prone to failure. Additionally, roller bushings may contact a support pin at as many as eight points. The resulting friction created between the support pin and the bushing, as well as friction created between moving parts within the bushing, may produce unwanted particles that can contaminate the substrate during processing. These issues are exacerbated by the increasingly high temperatures required for thin film deposition processes. At such temperatures, the thermal expansion of various components may cause increased friction and binding, and materials may reach softening points, leading to deformations which may result in device failure. Bushing failure may lead to broken panels, increased chamber maintenance costs, and decreased throughput due to chamber downtime.

SUMMARY OF THE INVENTION

The present invention generally provides a bushing assembly for supporting a substrate within a processing chamber. In one aspect, the bushing assembly comprises a tubular body having an outer perimeter and an aperture extending therethrough, a first ring having a first inner edge, the first ring being disposed in the aperture in an upper portion of the tubular body, and a second ring having a second inner edge, the second ring being disposed in the aperture in a lower portion of the tubular body. The first inner edge has a first radius of curvature, and the second inner edge has a second radius of curvature.

In another aspect, the bushing assembly comprises a tubular body having an outer perimeter and an aperture extending therethrough, a first ring having a first inner edge, the first ring being disposed in the aperture in an upper portion of the tubular body, and a second ring having a second inner edge, the second ring being disposed in the aperture in a lower portion of the tubular body. The first inner edge has a first radius of curvature, and the second inner edge has a second radius of curvature. A first inner edge diameter, a second inner edge diameter, the first radius of curvature, and the second radius of curvature are selected such that a support pin extending through the aperture contacts the bushing assembly on at most two points.

In yet another aspect, the bushing assembly comprises a tubular body having an outer perimeter and an aperture extending therethrough, a first ring having a first inner edge, the first ring being disposed in the aperture in an upper portion of the tubular body, a second ring having a second inner edge, the second ring being disposed in the aperture in a lower portion of the tubular body, and one or more alignment pins extending through the tubular body and coupled to the first ring and the second ring.

In yet another aspect, the bushing assembly comprises a tubular body having an outer perimeter and an aperture extending therethrough, the aperture extending through a middle portion of the tubular body to form a first diameter, a first ring disposed in a second diameter of the aperture in an upper portion of the tubular body, and a second ring disposed in a third diameter of the aperture in a lower portion of the tubular body. The second diameter and the third diameter are greater than the first diameter.

In yet another aspect, the bushing assembly comprises a tubular body having an outer perimeter and an aperture extending therethrough, a first ceramic ring having a first inner edge, the first ring being disposed in the aperture in an upper portion of the tubular body, and a second ceramic ring having a second inner edge, the second ring being disposed in the aperture in a lower portion of the tubular body. The first inner edge has a first radius of curvature, and the second inner edge has a second radius of curvature, and a first inner edge diameter, a second inner edge diameter, the first radius of curvature, and the second radius of curvature are selected such that a support pin extending through the aperture contacts the bushing assembly on at most two points.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention generally comprises a high-temperature slide bushing assembly for facilitating support pin movement within a processing chamber. The slide bushing assembly may include a plurality of rings disposed within a tubular body. The rings may have a rounded inner edge, designed to reduce the area of contact with a support pin. The rings may comprise a material having a low coefficient of thermal expansion, such as a ceramic, making the slide bushing assembly suitable for use in environments above 250° C. The design simplicity of the slide bushing assembly may improve device reliability in high-temperature processing environments, where traditional bushings are prone to failure, and may decrease bushing production costs by up to 50%. Additionally, by reducing the number of moving parts within the bushing assembly, fewer unwanted particles are generated during device operation, reducing the incidence of substrate contamination.

The invention will be illustratively described below in relation to a PECVD chamber available from AKT, a subsidiary of Applied Materials, Inc., Santa Clara, Calif. It is to be understood that the invention is equally applicable to any chamber that may require support pins, including physical vapor deposition (PVD) chambers. It is also to be understood that the invention described below is equally applicable to PECVD chambers, etching chambers, physical vapor deposition (PVD) chambers, plasma processing chambers, and other chambers made by other vendors.

Figure 1:
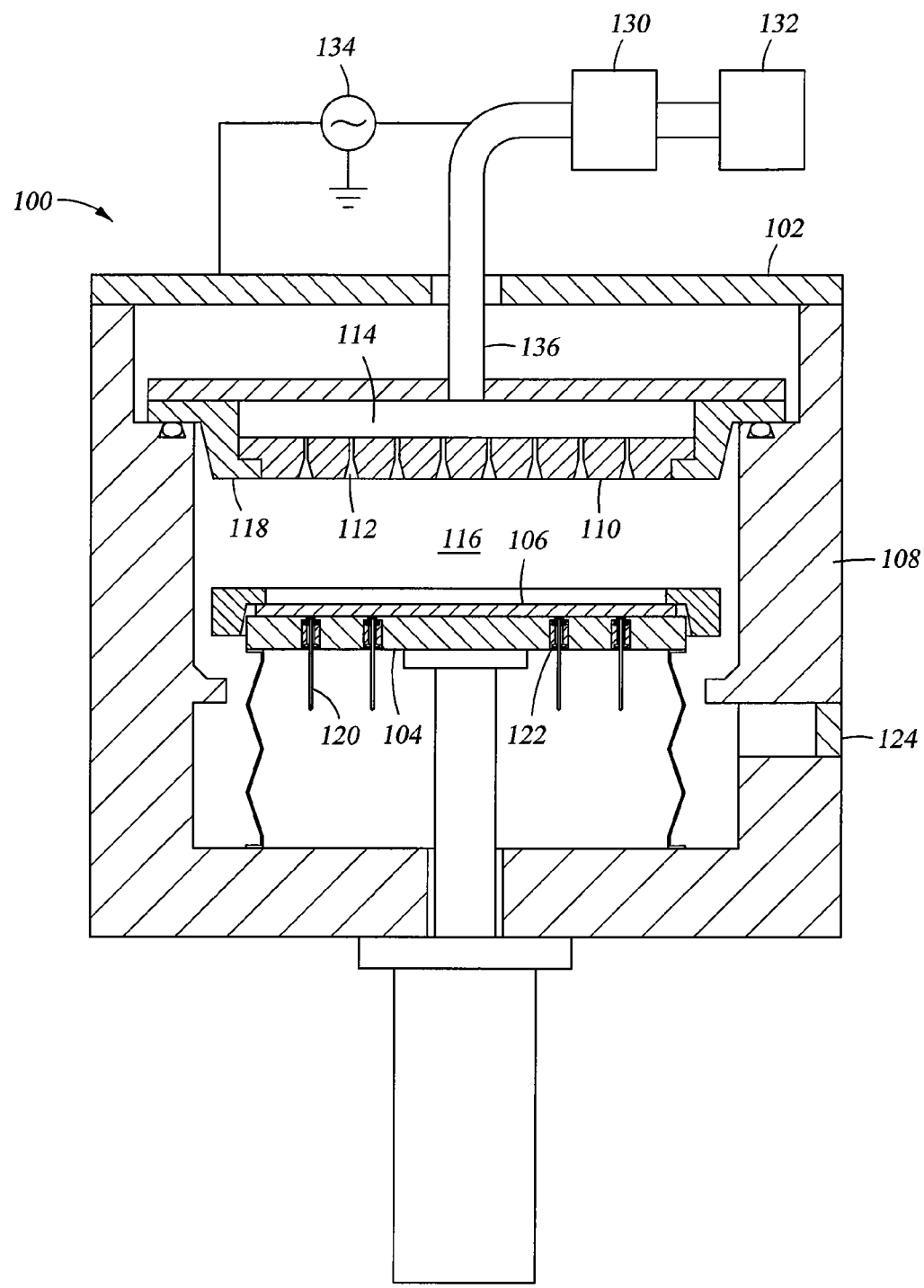
FIG. 1 is a schematic cross-sectional view of a plasma enhanced chemical vapor deposition apparatus 100 according to one embodiment of the invention.

FIG. 1 is a schematic cross-sectional view of a PECVD apparatus 100 according to one embodiment of the invention. The apparatus 100 comprises a lid assembly 102 coupled with a chamber wall 108. Within the apparatus 100, a showerhead 110 may be disposed opposite a substrate support 104, upon which a substrate 106 may be disposed for processing. The showerhead 110 may be supported by a bracket 118. The substrate 106 may enter and exit the apparatus 100 through a slit valve 124 disposed in the chamber wall 108. The substrate 106 may comprise a flat panel display substrate, a solar substrate, a semiconductor substrate, an organic light-emitting diode substrate (OLED), or any other substrate. The showerhead 110 may comprise one or more gas passageways 112 extending between a plenum 114 and the processing space 116. Gas introduced into the plenum 114 may be evenly dispersed behind the showerhead 110 for introduction into the processing space 116 through the gas passages 112. The gas may be provided by a gas source 132. The gas may travel from the gas source 132 through an RF choke 130 to a gas input 136, through which it may be introduced into the plenum 114. An RF power source 134 may also be coupled with the gas input 136 and the lid assembly 102.

One or more bushing assemblies 122 may be disposed in the substrate support 104. Support pins 120 may extend through the bushing assemblies 122, such that the bushing assemblies 122 facilitate movement of the support pins 120 along an axis perpendicular to the plane of the substrate support 104. In one aspect, when the substrate support 104 is in a lowered position, the support pins 120 extend through the bushing assemblies 122 to a position above the surface of the substrate support 104, and when the substrate support 104 is in a raised position, the support pins 120 are positioned below the surface of the substrate support 104.

In one embodiment of the invention, the substrate support 104 is a susceptor which may be raised and lowered within the PECVD apparatus 100 prior to and after processing of the substrate 106. For instance, prior to processing, the substrate support 104 may be in a lowered position, aligned with the slit valve 124, to accept a substrate 106. While in a lowered position, the support pins 120 may extend above the surface of the substrate support 104. The substrate 106 may be placed onto the support pins 120 upon entering the PECVD apparatus 100 through the slit valve 124. The support pins 120 may then be lowered with respect to the substrate support 104, placing the substrate 106 in contact with the substrate support 104. After being placed in contact with the substrate support 104, the substrate 106 may undergo heating and processing.

The bushing assemblies 122 may be arranged in a variety of patterns which enable the support pins 120 to provide adequate support to the substrate 106. For example, the bushing assemblies 122 may be uniformly distributed throughout the substrate support 104, or the bushing assemblies 122 may be concentrated in a particular area of the substrate support 104. Preferably, the distribution of the bushing assemblies 122 is designed to provide support for a substrate 106 having a particular shape, for example, a substrate having a rectangular shape, a square shape, a circular shape, or another geometric shape.

Figure 2A:
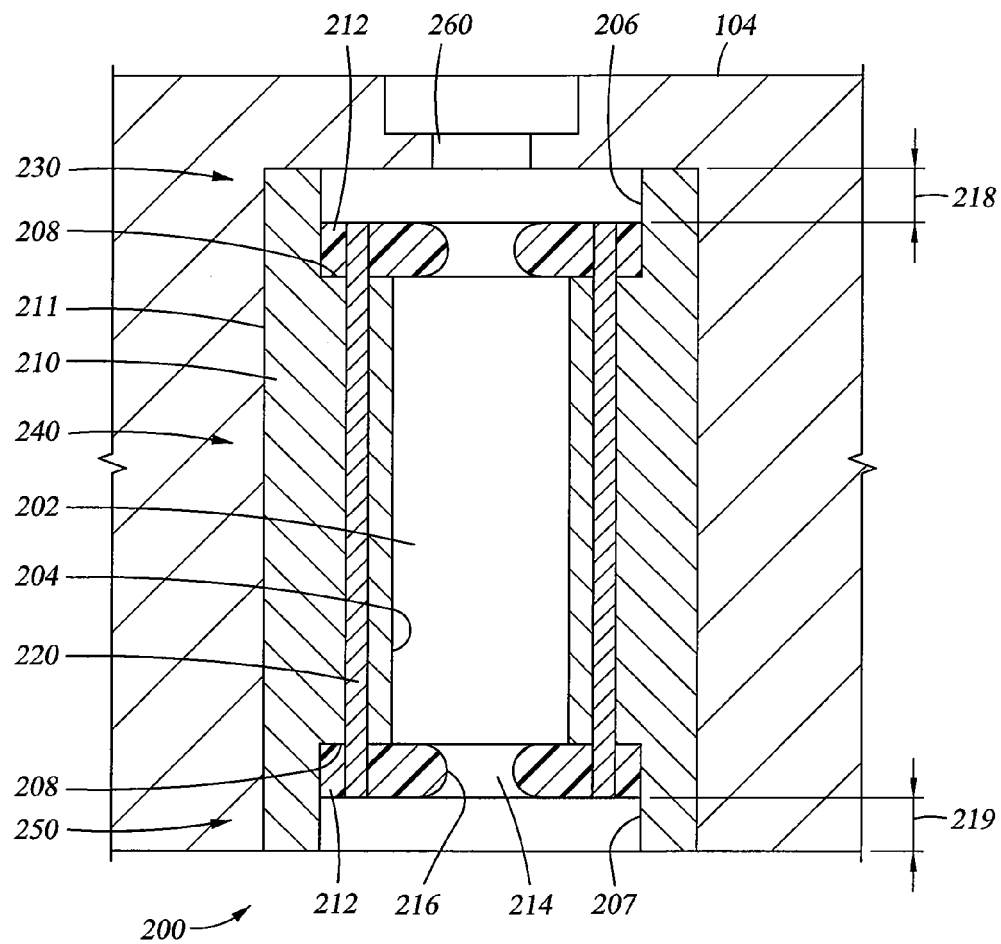
FIG. 2A is a schematic cross-sectional view of a slide bushing assembly 200 disposed in a substrate support 104 according to one embodiment of the invention.

FIG. 2A is a schematic cross-sectional view of a slide bushing assembly 200 disposed in a substrate support 104 according to one embodiment of the invention. The slide bushing assembly 200 comprises a tubular body 210 having an upper portion 230, a middle portion 240, a lower portion 250, an outer perimeter 211, and an aperture 202 extending through the outer perimeter 211. The aperture 202 extends through the middle portion 240 of the tubular body 210 to form a first diameter 204 and extends through the upper and lower portions 230, 250 of the tubular body 210 to form second and third diameters 206, 207, respectively. The first diameter 204 may meet with the second and third diameters 206, 207 to form ledges 208, upon which rings 212 may be disposed. Each ring 212 comprises an inner edge 216, which forms a ring aperture 214. The ring apertures 214 preferably align with a substrate support aperture 260.

Alignment pins 220 may be disposed within the tubular body 210. In this embodiment of the invention, the rings 212 may be disposed on the alignment pins 220 to ensure that the ring apertures 214 are properly aligned with one another. The alignment pins 220 may further operate to align the ring apertures 214 with the tubular body 210, such that, when the slide bushing assembly 200 is disposed in the substrate support 104, the ring apertures 214 line up with the substrate support aperture 260. The alignment pins 220 may comprise a ceramic material, such as aluminum oxide or silicon dioxide, allowing the pins 220 to function in high-temperature environments without significant thermal expansion or softening. In other embodiments, the alignment pins 220 comprise a metal, such as an aluminum alloy.

In one embodiment of the invention, the second and third diameters 206, 207 extend into the tubular body 210 to depths which are greater than the thicknesses of the rings 212. As a result, the rings 212 are offset from the top and bottom of the tubular body 210 by a first distance 218 and a second distance 219, respectively. In other embodiments of the invention, the rings 212 may not be offset from the top or bottom of the tubular body 210, or only one ring 212 may be offset from either the top or the bottom of the tubular body 210.

In embodiments of the invention, the rings 212 may be located near the ends of the tubular body 210. For example, the distance between an end of the tubular body 210 and the outer surface of a ring 212 may be about 0 to 3 times the thickness of the ring 212. In another embodiment, the distance between an end of the tubular body 210 and the outer surface of a ring 212 may be about 0.1 to 2 times the thickness of the ring 212. In yet another embodiment, the distance between an end of the tubular body 210 and the outer surface of a ring 212 may be about 0.5 to 1 times the thickness of the ring 212. In other embodiments, the distance between an end of the tubular body 210 and the outer surface of a ring 212 may be about 0.01 to 0.5 inches. In another embodiment, the distance between an end of the tubular body 210 and the outer surface of a ring 212 may be about 0.1 to 0.3 inches.

The slide bushing assembly 200 may be disposed in the substrate support 104 by insertion through a bottom surface of the substrate support 104. During processing of the substrate 106 (not shown), the substrate 106 may be heated by the substrate support 104. Consequently, it is desirable to ensure that the substrate support 104 and substrate 106 are in contact with one another. However, cold spots, or areas of lower temperature, may occur on areas of the substrate 106 below which a substrate support aperture 260 resides. By configuring the slide bushing assembly 200 to be inserted through the bottom of the substrate support 104, the size of the substrate support aperture 260 may be reduced, increasing the total surface area of the substrate support 104 which is in contact with the substrate 106 and reducing the incidence and severity of cold spots. Additionally, in embodiments in which the tubular body 210 is constructed of a material having good heat conduction properties, such as an aluminum alloy, the incidence and severity of cold spots may be further reduced by the conduction of heat from the substrate support 104 to portions of the tubular body 210 which are in contact with the substrate 106.

Figure 2B:
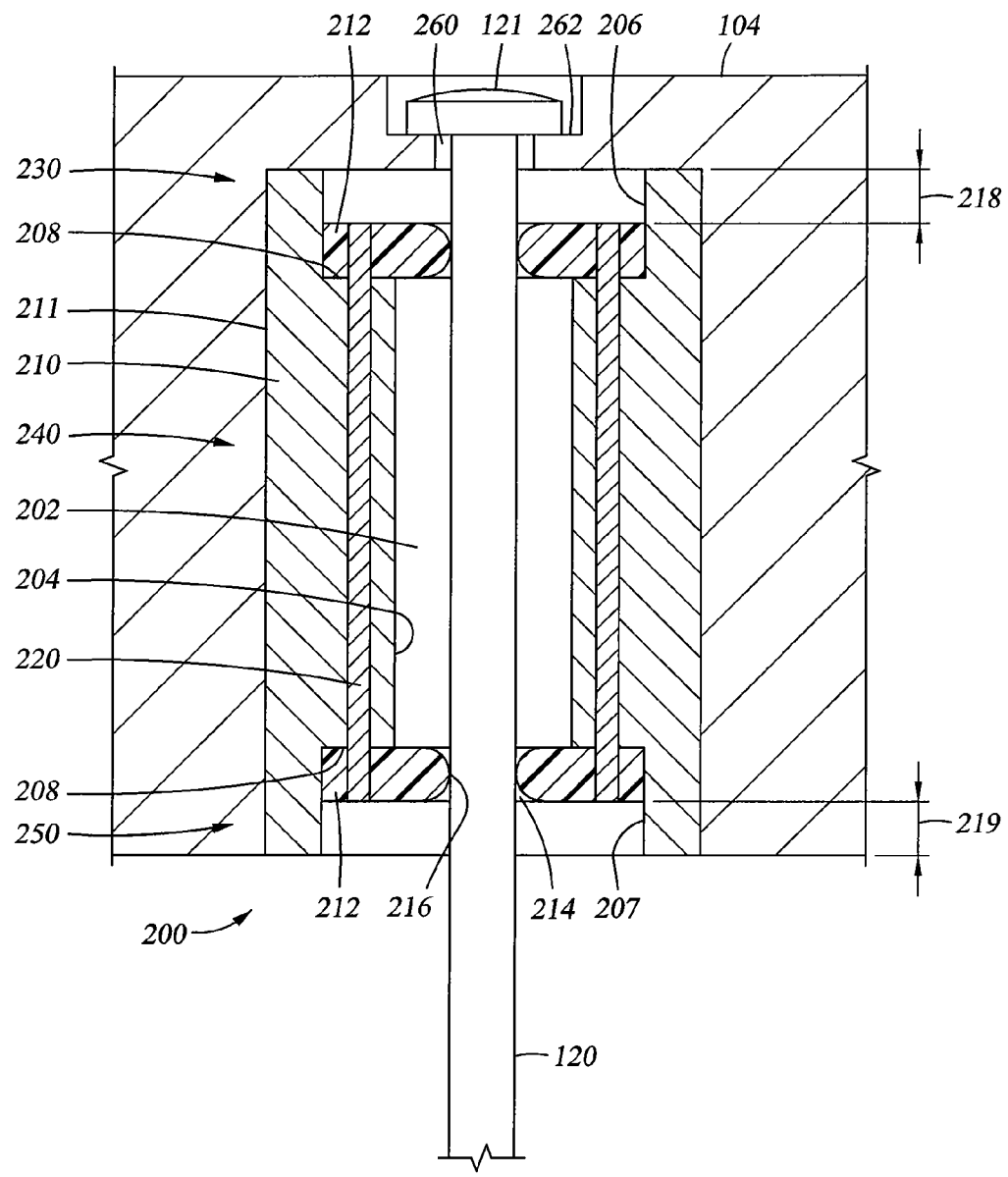
FIG. 2B is a schematic cross-sectional view of a support pin 120 extending through a slide bushing assembly 200 according to one embodiment of the invention.

FIG. 2B is a schematic cross-sectional view of a support pin 120 extending through a slide bushing assembly 200 according to one embodiment of the invention. The substrate support 104 may comprise a substrate support aperture 260, along which a substrate support ledge 262 is formed. The support pin 120 extends through the slide bushing assembly 200 and through the substrate support aperture 260 along an axis perpendicular to the plane of the substrate support 104. The support pin 120 comprises a support pin head 121, which is located at the top end of the support pin 120. When the support pin 120 is in a lowered position, the support pin head 121 may sit atop the substrate support ledge 262, as shown in FIG. 2B.

The support pin 120 extends through the slide bushing assembly 200 such that one or more points on the circumference of the support pin 120 are in contact with the inner edges 216 of the rings 212. The inner edges 216 may be rounded, reducing the surface area in contact between the support pin 120 and the rings 212. By reducing this surface area, the number of particles generated by friction, as the support pin 120 slides through the slide bushing assembly 200, may be reduced, and device lifetime and reliability may be improved.

In another embodiment of the invention, to further reduce friction between the support pin 120 and the slide bushing assembly 200, the support pin 120 contacts the slide bushing assembly 200 on at most two points. For instance, the diameters of the support pin 120 and the inner edges 216 may be selected such that the support pin 120 is in contact with at most one point on an inner edge 216 of each ring 212.

In yet another embodiment, the inner edges 216 may be rounded, with each inner edge 216 having a radius of curvature. The radius of curvature may be from about 0.025 to 2 inches. In another embodiment, the radius of curvature of the inner edges 216 is from about 0.05 to 1 inches. In yet another embodiment, the radius of curvature is from about 0.1 to 0.4 inches. Alternatively, the radius of curvature may be a function of the thickness of the rings 212. In one embodiment, the radius of curvature of the inner edges 216 is from about 0.25 to 2 times the thickness of a ring 212. In another embodiment, the radius of curvature may be from about 0.5 to 1 times the thickness of a ring 212.

The diameters and thicknesses of the rings 212 may be the same, or each ring 212 may have a different diameter and thickness. Additionally, the diameters of the ring apertures 214 and the radii of curvature of the inner edges 216 of each ring 212 may be the same, or these values may be different. In embodiments of the invention, the rings 212 may have thicknesses of about 0.05 to 1 inches. In another embodiment, the rings 212 may have thicknesses of about 0.1 to 0.5 inches. In yet another embodiment, the rings 212 may have thicknesses of about 0.2 inches. The diameters of the rings 212 may be about 0.5 to 3 inches. In another embodiment, the diameters of the rings 212 may be about 1 to 2 inches. In yet another embodiment, the diameters of the rings 212 may be about 1.5 inches. The ring apertures 214 may have diameters of about 0.05 to 1 inches. In another embodiment, the diameters of the ring apertures 214 are about 0.1 to 0.5 inches. In yet another embodiment, the diameters of the ring apertures 214 are about 0.23 inches.

In embodiments of the invention, the rings 212 may be located near the ends of the tubular body 210. For example, the distance between an end of the tubular body 210 and the outer surface of a ring 212 may be about 0 to 3 times the thickness of the ring 212. In another embodiment, the distance between an end of the tubular body 210 and the outer surface of a ring 212 may be about 0.1 to 2 times the thickness of the ring 212. In yet another embodiment, the distance between an end of the tubular body 210 and the outer surface of a ring 212 may be about 0.5 to 1 times the thickness of the ring 212. By increasing the distance between the rings 212, control of the support pin 120 is enhanced, and the torque applied to the rings 212 due to lateral forces on the support pin 120 may be reduced. Furthermore, by disposing the rings 212 at the ends of the tubular body 210, the slide bushing assembly 200 may be quickly and inexpensively assembled or refurbished. This design simplicity may decrease bushing production costs by up to 50%.

In order to ensure reliable operation of the slide bushing assembly 200 at a wide range of temperatures, the dimensions of certain components, such as the rings 212 and support pin 120, may be specified to have certain tolerances. For example, at high temperatures, reliable movement of the support pin 120 within the slide bushing assembly 200 may be accomplished with a tolerance of 0.0002 inches for the diameters of the ring apertures 214 and a tolerance of 0.0001 inches for the diameter of the support pin 120.

The deleterious effects of thermal expansion at high deposition temperatures may be substantially reduced where components of the slide bushing assembly 200, including the tubular body 210, rings 212, alignment pins 220, and support pin 120, comprise a material having a low coefficient of thermal expansion (CTE), such as a ceramic. Such effects, including cracking, misalignment, increased friction, binding, and device failure, are caused by differences in the rates at which different materials expand or contract during heating or cooling. Materials having a low coefficient of thermal expansion which may be used in the slide bushing assembly 200 include aluminum oxide and silicon dioxide. Additionally, the deleterious effects of thermal expansion may be further reduced by utilizing components having small dimensions, for example, a support pin 120 and ring apertures 214 having diameters of less than about 0.3 inches, since small-diameter components expand less during heating.

The tubular body 210 may comprise a material which enables the slide bushing assembly 200 to be used in high-temperature environments without experiencing a decrease in strength, for example, due to softening. In one embodiment, the tubular body 210 comprises a metal alloy. For example, the tubular body 210 may comprise an aluminum alloy, such as a 6061 grade aluminum alloy. In other embodiments, the tubular body 210 may comprise a material which may be used in high-temperature environments without experiencing significant thermal expansion, such as a ceramic material. The length of the tubular body 210 may be slightly shorter than the thickness of the substrate support 104. For example, in one embodiment, the length of the tubular body 210 is about 1 to 5 inches. In another embodiment, the length of the tubular body 210 is about 2 to 4 inches. In yet another embodiment, the length of the tubular body 210 is about 3 inches.

The rings 212 may comprise a ceramic material, for example, aluminum oxide or silicon dioxide. Preferably, the ring 212 material is selected to have a low coefficient of thermal expansion so that the ring 212 and ring aperture 214 do not significantly change in size or become misaligned when the substrate 106 is heated or cooled. The support pin 120 may comprise a ceramic or a metal. Preferably, the support pin 120 comprises a ceramic material, such as aluminum oxide. To reduce friction during operation of the slide bushing assembly 200, the support pin 120 may comprise a different material than the rings 212. For example, the support pin 120 may comprise aluminum oxide, while the rings 212 comprise silicon dioxide.

Figure 3A:
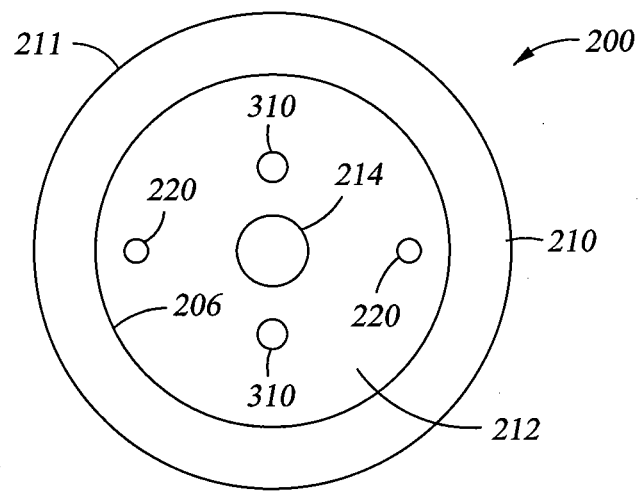
FIG. 3A is a schematic top view of a slide bushing assembly 200 according to one embodiment of the invention.

FIG. 3A is a schematic top view of a slide bushing assembly 200 according to one embodiment of the invention. The slide bushing assembly 200 comprises a tubular body 210 having a second diameter 206, a ring 212 having a ring aperture 214, alignment pins 220, and fastening mechanisms 310.

The fastening mechanisms 310 may extend axially through the tubular body 210 to couple one or more rings 212 to the tubular body 210. For example, each ring 212 may be coupled to the tubular body 210 by separate fastening mechanisms 310, or the same fastening mechanisms 310 may couple both rings 212 to the tubular body 210.

The fastening mechanisms 310 may comprise any mechanism suitable for attaching the rings 212 to the tubular body 210. For example, the fastening mechanisms 310 may comprise mounting screws or a nut and bolt configuration. The simplicity by which the fastening mechanism 310 couple the rings 212 to the tubular body 210 may significantly reduce the cost of the slide bushing assembly 200 in comparison to traditional bushings, such as roller bushings. Additionally, the ease of assembly and disassembly permits parts within the slide bushing assembly 200 to be replaced with minimal time and expense. For example, the rings 212 of the slide bushing assembly 200 may be replaced, allowing the tubular body 210 to be reused.

The fastening mechanisms 310 may be arranged in any pattern suitable for coupling the rings 212 to the slide bushing assembly 200. For example, one or more fastening mechanisms 310 may be located near the perimeter of the rings 212, coupling the rings 212 to the tubular body 210, or one or more fastening mechanisms 310 may be located near the ring aperture 214. In other embodiments, the fastening mechanisms 310 may couple the rings 212 to the tubular body 210 by insertion through the outer perimeter 211 of the tubular body 210. In yet another embodiment, the alignment pins 220 may also function as fastening mechanisms 310, or the fastening mechanisms 310 may also function as alignment pins 220.

Although FIG. 3A is representative of both the top and the bottom of the slide bushing assembly 200 according to one embodiment of the invention, embodiments in which the top of the slide bushing assembly 200 and the bottom of the slide bushing assembly 200 have different configurations, including different diameters, thicknesses, materials, and locations of components, are also within the scope of the invention.

Figure 3B:
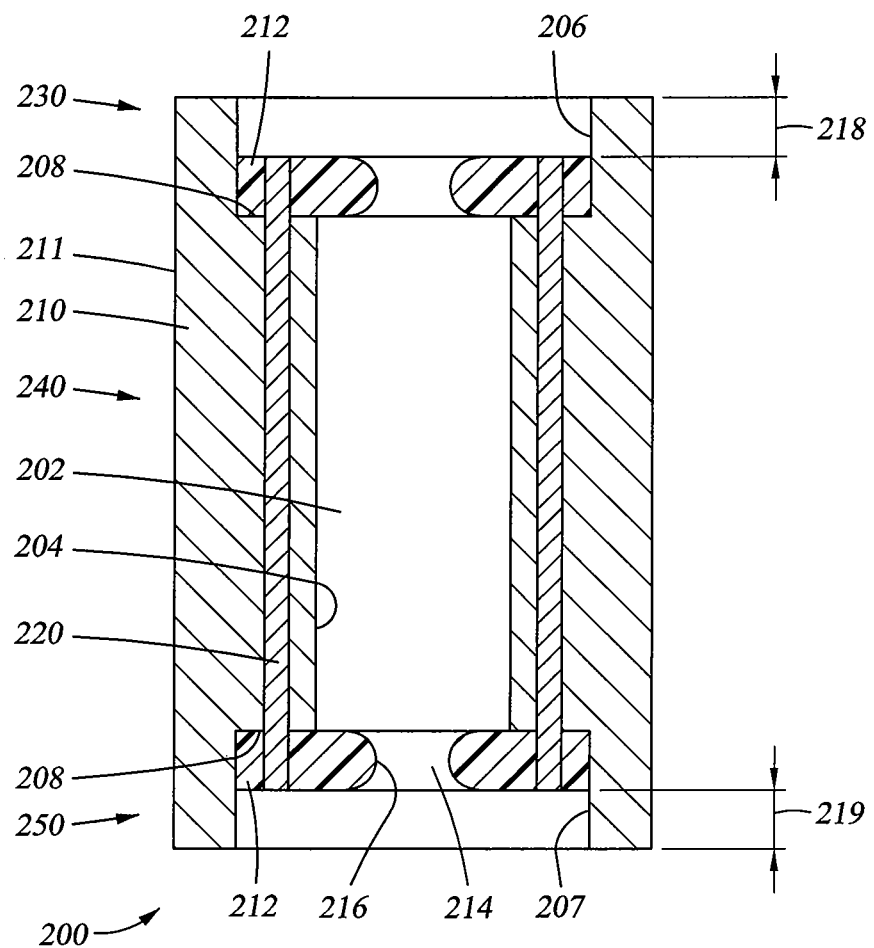
FIG. 3B is a schematic cross-sectional view of a slide bushing assembly 200 according to one embodiment of the invention.

FIG. 3B is a cross-sectional schematic view of a slide bushing assembly 200 according to one embodiment of the invention. The slide bushing assembly 200 comprises a tubular body 210 having an upper portion 230, a middle portion 240, a lower portion 250, an outer perimeter 211, and an aperture 202 extending through the outer perimeter 211. The aperture 202 extends through the middle portion 240 of the tubular body 210 to form a first diameter 204 and extends through the upper and lower portions 230, 250 of the tubular body 210 to form second and third diameters 206, 207, respectively. The first diameter 204 may meet with the second and third diameters 206, 207 to form ledges 208, upon which rings 212 may be disposed. Each ring 212 comprises an inner edge 216, which forms a ring aperture 214. In embodiments of the invention, the second and third diameters 206, 207 may extend into the tubular body 210 to depths which are greater than the thicknesses of the rings 212, resulting in an offset of a first distance 218 and a second distance 219.

While the foregoing is directed to embodiments of the present invention, other and further embodiments of the invention may be devised without departing from the basic scope thereof, and the scope thereof is determined by the claims that follow.

The invention claimed is:

1. A bushing assembly, comprising:
 a tubular body having an outer perimeter and an aperture extending therethrough;
 a first ring having a first inner edge, the first ring being disposed in the aperture in an upper portion of the tubular body;
 a second ring having a second inner edge, the second ring being disposed in the aperture in a lower portion of the tubular body;
 wherein the first inner edge has a first radius of curvature, and the second inner edge has a second radius of curvature; and
 one or more alignment pins extending through the tubular body, the one or more alignment pins coupled to the first ring and the second ring.

2. The bushing assembly of claim 1, wherein the one or more alignment pins comprise a ceramic.

3. A bushing assembly, comprising:
a tubular body having an outer perimeter and an aperture extending therethrough, the aperture extending through:
   a middle portion of the tubular body to form a first inner perimeter of the tubular body, the first inner perimeter having a first diameter;
   an upper portion of the tubular body to form a second inner perimeter of the tubular body, the second inner perimeter having a second diameter, wherein the second diameter is greater than the first diameter; and
   a lower portion of the tubular body to form a third inner perimeter of the tubular body, the third inner perimeter having a third diameter, wherein the third diameter is greater than the first diameter; and
a first ring disposed in the second inner perimeter of the upper portion of the tubular body, the first ring having a first inner edge;
a second ring disposed in third inner perimeter of the lower portion of the tubular body, the second ring having a second inner edge, wherein the first inner edge has a first radius of curvature and the second inner edge has a second radius of curvature, and wherein the second inner perimeter extends axially a distance greater than a thickness of the first ring; and
a fastening mechanism attaching at least one of the first ring or the second ring to the tubular body, wherein the fastening mechanism extends through the tubular body.

4. A bushing assembly, comprising:
a tubular body having an outer perimeter and an aperture extending therethrough, the aperture extending through:
   a middle portion of the tubular body to form a first inner perimeter of the tubular body, the first inner perimeter having a first diameter;
   an upper portion of the tubular body to form a second inner perimeter of the tubular body, the second inner perimeter having a second diameter, wherein the second diameter is greater than the first diameter; and
   a lower portion of the tubular body to form a third inner perimeter of the tubular body, the third inner perimeter having a third diameter, wherein the third diameter is greater than the first diameter;
a first ring disposed in the second inner perimeter of the upper portion of the tubular body;
a second ring disposed in the third inner perimeter of the lower portion of the tubular body, wherein the second inner perimeter extends axially a distance greater than a thickness of the first ring; and
a fastening mechanism attaching at least one of the first ring or the second ring to the tubular body, wherein the fastening mechanism extends through the tubular body.

5. A bushing assembly, comprising:
a tubular body having an outer perimeter and an aperture extending therethrough;
a first ring having a first inner edge, the first ring being disposed in the aperture in an upper portion of the tubular body;
a second ring having a second inner edge, the second ring being disposed in the aperture in a lower portion of the tubular body; and
a fastening mechanism extended axially through the tubular body, the fastening mechanism attaching at least one of the first ring or the second ring to the tubular body.

6. The bushing assembly of claim 5, wherein the tubular body has a middle portion formed between the upper portion and the lower portion of the tubular body, wherein the middle portion forms a first inner perimeter of the tubular body and the first inner perimeter has a first diameter, the upper portion forms a second inner perimeter of the tubular body and the second inner perimeter has a second diameter, the lower portion forms a third inner perimeter of the tubular and the third inner perimeter has a third diameter, and wherein the second diameter and the third diameter are relatively larger than the first diameter.

* * * * *

UNITED STATES PATENT AND TRADEMARK OFFICE
CERTIFICATE OF CORRECTION

PATENT NO. : 8,911,151 B2
APPLICATION NO. : 13/648082
DATED : December 16, 2014
INVENTOR(S) : Hou et al.

It is certified that error appears in the above-identified patent and that said Letters Patent is hereby corrected as shown below:

In Claims:

Column 9, Claim 3, Line 6, delete "haying" and insert --having-- therefor.

Signed and Sealed this
Second Day of June, 2015

Michelle K. Lee
*Director of the United States Patent and Trademark Office*